United States Patent [19]

Wollert et al.

[11] Patent Number: 5,351,002

[45] Date of Patent: Sep. 27, 1994

[54] TEST PROBE

[75] Inventors: Gary S. Wollert; Timothy J. Alho; Robert D. Braun, all of Kenosha, Wis.

[73] Assignee: Snap-on Incorporated, Kenosha, Wis.

[21] Appl. No.: 569,618

[22] Filed: Aug. 20, 1990

[51] Int. Cl.$^5$ ............................................. G01R 1/06
[52] U.S. Cl. ..................................... 324/754; 324/72.5
[58] Field of Search .................... 324/725, 149, 158 P, 324/158 F; 333/254, 260

[56] References Cited

U.S. PATENT DOCUMENTS

| 1,221,524 | 4/1917 | Frankel . | |
| 2,212,307 | 8/1940 | Smida | 439/482 |
| 2,457,506 | 12/1948 | Sorensen | 439/482 |
| 2,476,115 | 7/1949 | Runbaken | 324/72.5 |
| 2,517,032 | 8/1950 | Rogers et al. | 324/72.5 |
| 2,529,270 | 11/1950 | Webster | 324/72.5 |
| 2,702,892 | 2/1955 | Youger | 324/72.5 |
| 2,714,196 | 7/1955 | Melehan | 439/482 |
| 3,072,876 | 1/1963 | Balles, Jr. . | |
| 3,072,877 | 1/1963 | Landwehr | 439/482 |
| 3,182,257 | 5/1965 | Linkowski | 324/149 |
| 3,201,746 | 8/1965 | Askew . | |
| 3,402,351 | 9/1968 | Kradel | 324/149 |
| 3,644,877 | 2/1972 | Carbonneau | 324/72.5 |
| 3,757,218 | 9/1973 | Oliverio et al. | 324/72.5 |
| 3,821,689 | 6/1974 | Graham . | |
| 3,992,073 | 11/1976 | Buchoff et al. | 324/72.5 |
| 4,004,843 | 1/1977 | Boenning et al. . | |
| 4,178,058 | 12/1979 | Swenson . | |
| 4,214,132 | 7/1980 | Kelso | 324/158 P |
| 4,716,365 | 12/1987 | Pool . | |
| 4,721,903 | 1/1988 | Harsch et al. | 324/149 |
| 4,829,255 | 5/1989 | VanDerStuyf . | |

FOREIGN PATENT DOCUMENTS

| 3005255 | 8/1981 | Fed. Rep. of Germany | 324/149 |
| 1132868 | 3/1957 | France | 324/72.5 |
| 0683034 | 11/1952 | United Kingdom | 324/72.5 |

OTHER PUBLICATIONS

Cover page and p. 358 from Snap-On Tools Corp.'s 1990 catalog entitled "Snap-On".

Primary Examiner—Ernest F. Karlsen
Attorney, Agent, or Firm—Emrich & Dithmar

[57] ABSTRACT

The test probe comprises a handle and a rod, the rod including a flat face which can be placed against an electrical terminal to be tested. The rod includes a loop residing in a cavity in the handle. An alligator clip may be applied to the loop.

12 Claims, 2 Drawing Sheets

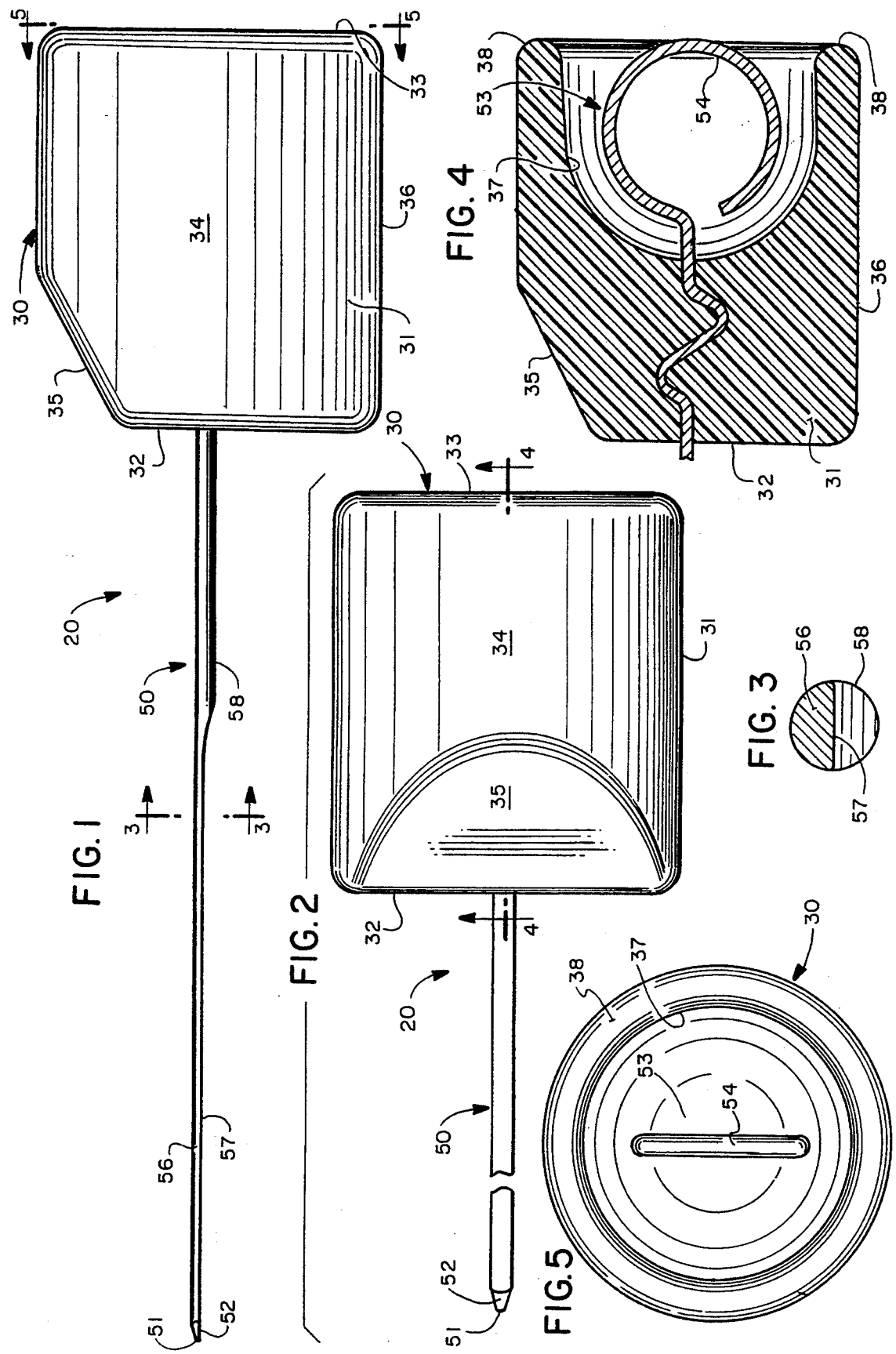

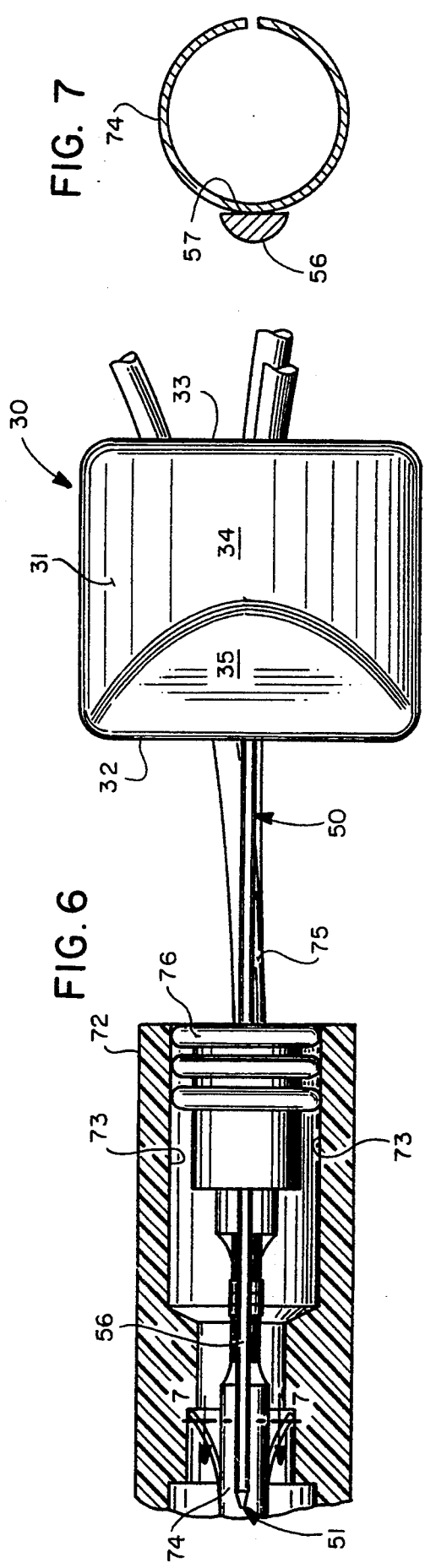
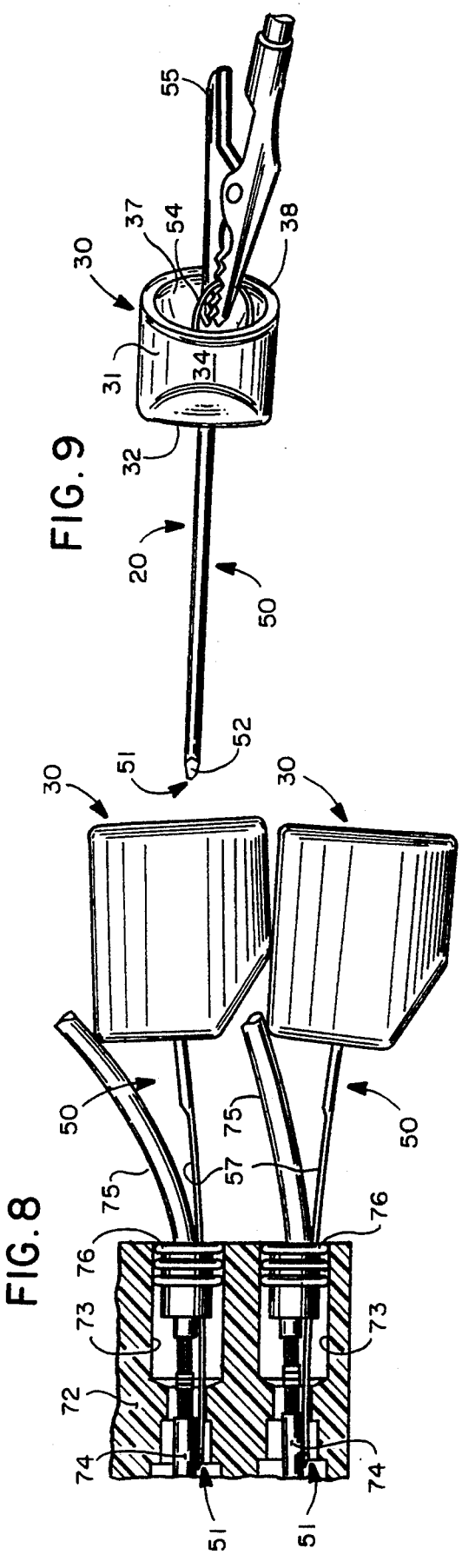

TEST PROBE

BACKGROUND OF THE INVENTION

This application deals generally with a probe for establishing a temporary electrical test connection with a terminal or wire of a circuit. Typically, such a probe includes an insulated handle, a rod extending from the handle, and a lead on the handle which is in electrical contact with the rod and adapted to be connected to a test wire.

Electrical connection with the terminal or a connector may be accomplished by sliding the rod of the probe inside the connector until the rod is disposed against the terminal. Since the terminal is flat and the rod is cylindrical, only a minimal surface area of the rod contacts the terminal. As a result, electrical contact between the probe and the terminal is disadvantageously minimized.

Further, currently available probes are disadvantageous because the terminal projecting from the back of the handle is not protected from incidental contact with neighboring components as the probe is slid into the connector.

Another disadvantage of current test probes is their unnecessarily complex shape and structure. As a result, the manufacture is complicated and the cost is increased.

SUMMARY OF THE INVENTION

It is a general object of the present invention to provide a test probe which avoids the disadvantages of prior test probes while affording additional structural advantages.

Another object of the invention is to provide a test probe adapted to provide maximum electrical contact with the terminal.

Another object of the invention is to provide a test probe having a rod of minimal cross section so as to enable access to a terminal in a confined space.

Another object of the invention is to provide a test probe having a test lead protected from incidental contact with neighboring components.

Another object of the invention is to provide a probe which is inexpensive and easy to manufacture.

In summary, there is provided an electrical test probe comprising a handle and a rod including a free end and an opposite end secured in the handle, the rod including a longitudinally extending generally flat face, the rod being adapted to be disposed against an electrical terminal to be tested such that the flat side abuts the terminal. According to the invention, the handle includes a cavity in the end opposite the end securing the rod, the end of the rod secured in the handle residing in the cavity for connection to a test lead of a meter.

The invention consists of certain novel features and a combination of parts hereinafter fully described, illustrated in the accompany drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated, FIG. 1 is a side-elevational view of a test probe, on an enlarged scale, embodying the features of the present invention;

FIG. 2 is a top-plan view of the test probe, with a portion of the rod therein broken away;

FIG. 3 is a cross-sectional view of the rod, taken along the line 3—3 of FIG. 1;

FIG. 4 is a cross-sectional view taken along the line 4—4 of FIG. 2;

FIG. 5 is an end view taken along the line 5—5 of FIG. 1;

FIG. 6 is a side-elevational view of the test probe in electrical connection with a terminal inside a connector, the connector being broken away and shown in partial cross-section;

FIG. 7 is a cross-sectional view taken along the line 7—7 of FIG. 6;

FIG. 8 is a top-plan view of a pair of probes in electrical connection with adjacent terminals inside the connector, the connector being broken away and shown in partial cross-section; and FIG. 9 is a perspective view of the test probe connected to a test lead of a meter.

DETAILED DESCRIPTION OF THE PREFERRED EMBODIMENT

Referring now to the drawings, and more particularly to FIGS. 1 and 2, there is depicted a test probe generally designated 20, constructed in accordance with the present invention. The probe 20 is adapted to make an electrical test connection into a connector 70 such as the automotive connector shown in FIG. 6.

The probe 20 comprises a handle 30 and a rod 50. The handle 30 includes a generally cylindrical body 31 made of non-conducting material. The body 31 has opposite ends 32 and 33 and an outer surface 34. The outer surface 34 includes a thumb-receiving flat portion 35 adjacent the end 32 and at an acute angle with respect to the longitudinal axis of the rod 50. Another finger can be positioned on the portion 36 of surface 34 which is opposite the portion 35. The rod 50 includes a free end 51 having a chamfered tip 52.

Referring to FIGS. 4 and 5, a generally semi-spherical cavity 37 extends from the end 33 into the body 31. The cavity 37 defines a circumferential lip 38 at the end 33. The rod 50 includes an end 53, opposite the free end 51, secured in the handle 31. The end 53 extends through the body 31 and terminates in a loop 54 residing in the cavity 37 for connection to a test lead 55 (FIG. 9) of a meter (not shown). Although the segment of the rod between segment 58 and loop 54 is shown as sinuous (FIG. 4) that segment could also be straight, but flattened on its sides, for example, to provide good retention by the body 31. The cavity 37 extends into the body 31 a depth sufficient to receive the entire loop 54.

Referring to FIGS. 1 and 3, the rod 50 includes a first segment 56 having a longitudinally extending flat face 57 and a second segment 58 of circular cross section extending from the first segment 56 and into the handle 30. The first segment 56 is substantially longer than the second segment 58. The rod 50 is preferably made of spring steel. The rod 50 is oriented and secured to the handle 30 such that the thumb-receiving portion 35 is directed oppositely to the flat face 57. The finger-receiving portion 36 and the flat face portion 57 of rod 50 (FIG. 3) face the same direction.

As shown in FIGS. 6 and 8, the probe 20 is adapted to establish an electrical connection into the connector 70. The connector 70 includes a plurality of terminal ports 73. A terminal 74 and a wire 75 connected thereto are disposed in each of the ports 73. The wire 75 extends through a flexible rubber connector seal 76 disposed in each of the ports 73. The wire 75 is comprised of a metal core surrounded by an insulation layer.

The electrical connection between the rod 50 and the terminal 74 is established as follows. The probe 20 is grasped by a user's hand such that the thumb is placed on the portion 35 and the index finger is placed on the portion 36. As a result of the predetermined orientation between the portions 35 and 36 and the flat face 57, the user is aware of the orientation of the face 57 with respect to the wire 75 without examining the rod 50. Thus, the probe 20 can easily be positioned such that the face 57 abuts the wire 75. The probe 20 is then slid inwardly between the seal 76 and along the wire 75, with the face 57 in contact therewith, until the rod 50 is disposed against the terminal 74 (FIG. 7). The test lead 55 is then coupled to the loop 54 (FIG. 9) so that resistance tests or the like may be performed.

The diameter of the handle 30 causes the displacement of the wire 75 during insertion, in turn causing the displacement the of terminal 74 towards the rod 50, to enhance the contact between the flat face 57 and the terminal 74. Further, the diameter of the handle 30 is such as to assure that the wire portion 50 of one probe does not contact the wire portion 50 of another probe 20 being used in an adjacent port 73 (FIG. 8).

Because the face 57 is flat, access to a terminal in a confined space is possible. Also, maximum surface-to-surface contact between the rod 50 and the terminal 74 occurs. The cross-sectional dimension of segment 56 is such as to minimize deformation, and thus damage, to the connector seal 76.

While a particular embodiment of this invention has been described, it is to be understood that changes can be made in such embodiment without departing from the spirit and scope of the invention as defined in the claims.

What is claimed is:

1. An electrical test probe comprising: a handle, and a one-piece metal rod including a free end and an opposite end fixedly secured in said handle, a substantial portion of said rod including a longitudinally extending generally flat conductive face extending substantially parallel to the longitudinal axis of said rod, said face and said portion having the same length, said rod being adapted to be disposed against an electrical terminal to be tested such that said flat face abuts the terminal.

2. An electrical test probe comprising: a handle, and a one-piece metal rod including a free end and an opposite end fixedly secured in said handle, a substantial portion of said rod including a longitudinally extending generally flat conductive face extending substantially parallel to the longitudinal axis of said rod, said rod being adapted to be disposed against an electrical terminal to be tested such that said flat face abuts the terminal, said rod including a first segment having said flat face and a second segment of circular cross-section extending from the first segment and into said handle, the cross-dimensions of said first and second segments being generally the same measured in at least one direction, said face and said segment having the same length.

3. The probe of claim 2, wherein said first segment is substantially longer than said second segment.

4. The probe of claim 1, wherein said handle includes a cavity in the end opposite the end securing said rod, said end of said rod secured in said handle residing in said cavity for connection to a test lead.

5. The probe of claim 4, wherein the end of said rod secured to said handle includes means for connecting said rod to the test lead.

6. An electrical test probe comprising: a handle, and a one-piece metal rod including a free end and an oppose end fixedly secured in said handle, a substantial portion of said rod including a longitudinally extending generally flat conductive face, said rod being adapted to be disposed against an electrical terminal to be tested such that said flat face abuts the terminal, said handle including a cavity in the end opposite the end securing said rod, said end of said rod secured in said handle residing in said cavity, and a loop at said opposite end of said rod for connection to said test lead, said loop residing in said cavity.

7. The probe of claim 4, wherein the cross-dimension of said handle is substantially greater than the cross-dimension of said rod.

8. The probe of claim 4, wherein said handle is generally cylindrical.

9. An electrical test probe comprising: a handle, and a one-piece metal rod including a free end and an opposite end secured in said handle, a substantial portion of said rod including a longitudinally extending generally flat conductive face, said rod being adapted to be disposed against an electrical terminal to be tested such that said flat side abuts the terminal to maximize electrical contact between the terminal and said rod, said rod including a longitudinally extending flat face, said handle including an outer surface having a thumb receiving portion and a finger receiving portion, said thumb receiving portion being directed oppositely to said flat face and said finger receiving portions having the same direction as said flat face and finger receiving portions respectively having a predetermined orientation with respect to said flat face of said rod to facilitate positioning of said flat face against said terminal.

10. The probe of claim 9, wherein said thumb portion is generally flat.

11. The probe of claim 10, wherein said thumb portion is generally flat, said thumb portion at an acute angle with respect to the longitudinal axis of said rod.

12. The electrical probe of claim 1, wherein the length of said rod is substantially greater than the length of said handle.

* * * * *

UNITED STATES PATENT AND TRADEMARK OFFICE
CERTIFICATE OF CORRECTION

PATENT NO. : 5,351,002
DATED : September 27, 1994
INVENTOR(S) : Gary S. Wollert et al.

It is certified that error appears in the above-indentified patent and that said Letters Patent is hereby corrected as shown below:

Column 4, lines 19 and 20, "oppose" should be --opposite--.

Signed and Sealed this

Twenty-second Day of November, 1994

Attest:

BRUCE LEHMAN

Attesting Officer

Commissioner of Patents and Trademarks